United States Patent [19]

Spielman

[11] Patent Number: 5,519,752
[45] Date of Patent: May 21, 1996

[54] X-RAY TRANSMISSIVE DEBRIS SHIELD

[75] Inventor: Rick B. Spielman, Albuquerque, N.M.

[73] Assignee: Sandia Corporation, Albuquerque, N.M.

[21] Appl. No.: 322,533

[22] Filed: Oct. 13, 1994

[51] Int. Cl.⁶ .................................................... G21K 1/10
[52] U.S. Cl. ............................ 378/161; 378/203; 378/204
[58] Field of Search ..................................... 378/161, 204, 378/140, 203

[56] References Cited

U.S. PATENT DOCUMENTS

| | | | |
|---|---|---|---|
| 2,873,379 | 2/1959 | Berends | 378/202 |
| 4,362,965 | 12/1982 | Kendall | 313/420 |
| 5,090,046 | 2/1992 | Friel | 378/161 |
| 5,185,776 | 2/1993 | Townsend | 378/167 |
| 5,329,569 | 7/1994 | Spielman | 378/161 |
| 5,335,259 | 8/1994 | Hayashida et al. | 378/161 |

OTHER PUBLICATIONS

Webster's Encyclopedia Unabridged Dictionary of the English Language.

*Primary Examiner*—Don Wong
*Attorney, Agent, or Firm*—George H. Libman

[57] ABSTRACT

An X-ray debris shield for use in X-ray lithography that is comprised of an X-ray window having a layer of low density foam exhibits increased longevity without a substantial increase in exposure time. The low density foam layer serves to absorb the debris emitted from the X-ray source and attenuate the shock to the window so as to reduce the chance of breakage. Because the foam is low density, the X-rays are hardly attenuated by the foam and thus the exposure time is not substantially increased.

16 Claims, No Drawings

X-RAY TRANSMISSIVE DEBRIS SHIELD

The United States Government has rights in this invention pursuant to Contract No. DE-AC04-76DP00789 between the Department of Energy and American Telephone and Telegraph Company.

BACKGROUND OF THE INVENTION

1. Field of the Invention

This invention relates to an impulse-reducing X-ray debris shield useful in X-ray microlithography.

2. Description of the Prior Art

Microelectronic devices such as semiconductor chips are formed through the use of microlithography. In general, microlithography comprises imagewise exposing a photosensitive resin supported on a substrate to an imaging wavelength(s) of electromagnetic radiation. The imaging radiation can be uv, X-ray, etc. The radiation is applied imagewise by projecting the radiation through a mask. The design on the mask selectively blocks out the radiation and thereby forms a corresponding image in the photosensitive resin. This image, either positive or negative, is subsequently developed by applying a solvent in order to selectively remove the unexposed areas (a negative resist) or the exposed areas (a positive resist). The result is the formation of a planer image. The developed photoresist and substrate are subsequently treated by etching, stripping, etc. in order to form the final microelectronic device.

X-ray microlithography is based on the use of X-rays as the imaging irradiation. Because X-ray sources, which are typically very hot plasmas, expel hot gases, micron-sized particles, charged particles, and other debris, it is conventional to employ a debris shield or X-ray window between the X-ray source and the mask. Ideally, the debris shield should not absorb or attenuate any of the X-ray irradiation while stopping all debris. However, in practice, the materials used for such X-ray transmissive debris shields do attenuate the X-ray radiation to some extent. The attenuation of the X-ray radiation reduces the energy of the exposure and thus causes an increase in the exposure time of the resist.

To avoid this attenuation of the X-ray radiation, the debris shields have been made very thin, such as around 1–25 microns in thickness. Because there is less material for the X-rays to pass through, a thinner debris shield will attenuate less X-ray radiation than a thicker debris shield. However, a thinner debris shield is structurally less durable than a thicker debris shield. Accordingly, thinner debris shields break more easily and often in response to the forces exerted thereon by the X-ray source. Indeed, today a conventional thin X-ray debris shield will typically last for two to six exposures before breaking. Once the debris shield breaks, the photoresist that was being exposed during the break is discarded and a new debris shield and fresh photoresist are placed into the exposure device.

Accordingly, the prior art faced a dilemma. On the one hand, thicker debris shields could be used in order to have less down time and less product waste. However, such a solution came at the cost of longer exposure times and thus a slower output. On the other hand, thin debris shields could be employed which would absorb only small amounts of X-ray radiation and thereby allow quicker exposure times and higher production speeds. But this solution suffered from frequent downtime due to the rapid breakage of the thin debris shield. A technique for providing both low attenuation of X-ray radiation so that short exposure times can be maintained and structural durability so that the debris shield will have a longer life and require less replacement is thus needed.

SUMMARY OF THE INVENTION

The present invention relates to a technique for simultaneously achieving the above described requirements.

Accordingly, it is an object of the present invention to provide an X-ray transmissive debris shield that exhibits low X-ray attenuation and improved resistance to breakage.

It is another object of the present invention to improve the efficiency of X-ray microlithography techniques.

These and other objects are achieved by a debris shield that comprises an X-ray window and a layer of low density foam disposed thereon.

By providing a layer of low density foam on the conventional X-ray debris shield, or window, the structural integrity of the shield is greatly increased without significantly increasing the X-ray attenuation. Specifically, the low density foam absorbs the debris and thus cushions the window. Further, the foam attenuates the shock generated by the impact of the debris and gas and temporarily spreads out the peak pressures applied to the window. This combination of attenuation and dispersion reduces the total impulse and peak accelerations delivered to the window, thereby reducing the risk of breaking the window and increasing the useful lifespan of the debris shield.

DETAILED DESCRIPTION OF THE INVENTION

The window of the X-ray debris shield used in the present invention can be any of the known prior art X-ray windows. Such windows are highly transparent to X-ray radiation. As used in this context, X-ray radiation refers to photons having an energy of at least about 100 eV. Any material or combination of materials that is substantially transparent to such radiation can be used as the X-ray window of the present invention.

Generally, materials that exhibit low X-ray attenuation are made of low Z elements; that is, elements having 16 or fewer protons such as beryllium, boron, carbon, nitrogen and/or silicon. Accordingly, windows can be made of diamond, metal or metal compounds such as beryllium and boron nitride, or plastic such as thermosetting polymers. Specific examples of plastics include polyimides, polycarbonates, nylons, polystyrenes, polypropylenes, polyethylenes, and polyvinylchlorides. The polyimides, polycarbonates and nylons are the more preferred plastics and are available under such brand names as KAPTON, KIMFOL, AND MYLAR, respectively. The window can also be a composite of one or more materials such as taught in U.S. Pat. No. 5,329,569, which is incorporated herein by reference.

The window used in the present invention can have a thickness ranging from 1 to 75 microns, but typically ranging from 5 to 50 microns. The shape of the window is essentially planar and can be in any suitable form including square, rectangular and circular. The total surface area of one side (one major planar face) of the window is typically less than 1000 $cm^2$, and generally from 1 to 100 $cm^2$.

The windows are in general commercially available in a broad range of thicknesses. Alternatively, the windows can be made by techniques well known in the art.

The low density foam used in the present invention is not particularly limited. Virtually all low density foams, because of their low density, will be low in X-ray attenuation and are thus suitable for use in the present invention. In this regard, low density foams, as that term is used in this application, have a density of less than 100 $mg/cm^3$, preferably from 1 to 100 mg/cm$^3$, more preferably from 5 to 75 mg/cm$^3$, and most preferably from 5 to 50 mg/cm$^3$. The low density foam used in the present invention can thus be any one of the known low density foams, including foams similar to those used in fire fighting and thermal insulation.

Preferably, the foam is composed of elements that have a low atomic number (low Z elements) in order to further reduce the X-ray attenuation. In this regard, the elements preferably have an atomic number of less than sixteen, more preferably less than eight. Accordingly, the low density foam is preferably made from low Z polymers, low Z prepolymers, low Z oligomers, or combinations thereof.

Examples of low density foam compositions include silica-based foams, such as aerogels, and carbon-based foams such as TPX and Agar-Agar. Carbon-based foams having long carbon chains forming a prepolymer or polymer, are particularly preferred. The number of carbon repeating units; i.e., CH$_2$, in the carbon chain ranges from 25 to 1000. The carbon chain may be interrupted by oxygen atoms, as in the case of Agar-Agar. The carbon chains may be saturated or unsaturated, branched or straight chain, cyclic or acyclic, substituted or unsubstituted. Substituents include a halogen atom, a hydroxyl group, an amine group, a carbonyl group, and a carboxyl group, which may be present in the main chain or as a monovalent substituent bonded to the carbon backbone.

Preferably the carbon chains contained in the low density foams of the present invention can be represented by the empirical formula $(CH_y)_x$ or $(CH_yO_w)_x$ wherein x ranges from 25 to 50000, more preferably from 50 to 2000, y ranges from 1 to 2, and w ranges from 0.1 to 1. Such carbon chains are present in the foam as structured or unstructured polymers. Specific examples of such hydrocarbon foams are polystyrenes, polyethylenes, and polypropylenes.

The foam composition may contain a mixture of prepolymers and polymers having varying chain lengths. Further, gelatin and other conventional additives can be added to the foam composition in order to increase the strength of the low density foam. For example, a 1:1 ratio of gelatin and Agar-Agar can be used as the low density foam composition of the present invention.

Examples of low density foams and their methods of formation are set forth in the following articles, each of which is hereby expressly incorporated herein in its entirety:

1. A. Coudeville, et al., *Vacuum Science Technology* 18, 1227 (1981)
2. A. T. Young, et al., *J. Cellular Plastics* 20, 94 (1982)
3. J. H. Aubert, et al., *Polymer* 26, 2047 (1985)
4. A. T. Young. *J. Cellular Plastics* 23, 55 (1987)
5. J. M. Williams and J. E. Moore, *Polymer* 28, 1950 (1987)
6. J. H. Aubert, *Macromolecules* 21, 3468 (1988)
7. J. M. Williams, *J. Mat. Science* 23, 900 (1988)
8. A. N. Nyitray and J. M. Williams, *J. Cell. Plastics* 25, 217 (1989)
9. J. D. LeMay, et al., *MRS Bull.* 15, 19 (1990)
10. C. L. Jackson and M. T. Shaw, *Polymer* 31, 1070 (1990)
11. C. L. Jackson, et al., *Polymer* 32, 221 (1991)
12. M. H. Ozkul, et al., *Mater. Res. Soc. Symp. Proc.* 207, 15 (1991)

The thickness of the low density foam layer is not particularly limited. In general, the thickness of the low density foam layer will be such that, based upon the particular foam composition and the intended X-ray source, the best overall balance of properties is achieved. Typically, the low density foam has a thickness in the range of 25–5000 microns, more preferably 50–2,000 microns. Although the low-density foam can be coated to a relatively thick layer in comparison to the thickness of the window, such does not substantially affect the exposure time because of the low density of the foam; i.e., generally around 1 percent that of the window.

The low density foam can be formed by conventional and known techniques. In general, the foam is formed by mixing the foam components with an appropriate solubilizing solvent, freezing, and then vacuum drying off the solvent. Typical solvents include water, hexane, p-xylene, and mixtures thereof.

In the present invention, the low density foam is preferably formed directly on the window. This is achieved by dipping the window into a solution that contains the foam components or spraying or painting the foam solution onto the window. The coated window is then freeze dried in order to drive off the solvent thereby leaving the low density foam.

The thickness of the low density foam layer will be determined by the speed at which the window is placed into and removed from the dissolved foam solution (or the amount of liquid applied), the viscosity of the liquid itself, and the temperature of the window. The density of the low density foam layer is based upon the elemental composition of the foam as well as the solvent ratio of the liquid solution. A higher solvent to foam ratio will result in a lower density foam. The foam components are usually diluted by the solvent at a dilution ratio (mass/mass) of $10^{-3}$ to $10^{-1}$.

The low density foam should be present on one side of the window; namely, the side intended to face the X-ray source. The low density foam can be limited to only one side of the window, if necessary, by washing off the solution on one side of the window before it dries° Alternatively, after dipping the window and drying as described above, the low density foam could be removed from one side of the window by mechanical means (stripping) or chemical means (dissolving).

Another technique for applying the foam to the window is to first form a large block of foam. A thin slice of foam cut from the block can be attached to the window by the use of a small amount of solvent. Specifically, by placing the low density foam material in contact with a small amount of solvent on the surface of the window, a portion of the low density foam will dissolve into the solvent. Upon drying the low density foam will be sufficiently adhered to the window.

The debris shield can be used in the same manner as the prior art debris shields without the need for modifying the equipment or process. The shield is thus placed between the X-ray source and the mask with the low density foam facing the X-ray source. The X-ray source should preferably produce photons with energies greater than 0.5 KeV. Because of the pressure attenuation effects provided by the low density foam layer, the debris shields according to the present invention have a significantly enhanced life expectancy in comparison to debris shields that do not contain a layer of low density foam. For example, while a conventional thin window debris shield might be expected to last for approximately four exposure cycles, the debris shield according to the present invention may last for 400 exposure cycles. Moreover, this improvement in longevity does not come at the expense of significantly longer exposure times.

Correspondingly, if desired, debris shields that employ a window even thinner than those conventionally used in the prior art can now be employed because of the improved structural integrity provided by the layer of low density foam. By using an even thinner window the attenuation of X-ray radiation will be further reduced thereby allowing shorter exposure times and greater overall efficiency.

The use of the debris shield of the present invention thus enables the production of microelectronic devices at a faster rate, with greater yields, less down time, and lower waste than the previously employed methods.

The following example serves to illustrate the present invention. However, this is only an example and should in no way be taken as limiting the present invention.

EXAMPLE 1

A foam solvent solution is applied to one side of an 8 μm thick beryllium X-ray window (foil) at room temperature so as to provide a liquid film of about 1 mm in thickness. The foam solvent solution comprises 10 g of Agar-Agar protein $((CH_{1.5}O_{0.8})_x)$ per 1 liter of p-xylene/water solvent (1:2). The combination of foil/foam solvent is cooled to −20° C. for about 1 hour in order to freeze the foam solvent solution. The foil assembly is then placed in a vacuum chamber at 1 mTorr for 1–2 hours to vacuum extract the solvent. The resulting low density foam has a thickness of 1 mm and a final density of approximately 0.005–0.01 $g/cm^3$. The completed X-ray debris shield is ready to be placed between the X-ray source and the mask.

The invention having been thus described, it will be obvious that the same may be varied in many ways. Such variations are not to be regarded as a departure from the spirit and scope of the invention, and all such modifications as would be obvious to one skilled in the art are intended to be included within the scope of the following claims.

I claim:

1. An x-ray debris shield for use adjacent an X-ray source, said shield comprising an X-ray window and a layer of low density foam disposed on a side of said window facing the source to protect said window from debris from the source, said foam having a density less than 100 $mg/cm^3$.

2. The debris shield according to claim 1, wherein said low density foam has a density within the range of 1 $mg/cm^3$ to less than 100 $mg/cm^3$.

3. The debris shield according to claim 2, wherein said low density foam has a density within the range of 5 $mg/cm^3$ to 75 $mg/cm^3$.

4. The debris shield according to claim 3, wherein said low density foam has a density within the range of 5 $mg/cm^3$ to 50 $mg/cm^3$.

5. The debris shield according to claim 1, wherein said layer of low density foam has a thickness in the range of 25–5000 microns.

6. The debris shield according to claim 5, wherein said layer of low density foam has a thickness in the range of 50–2,000 microns.

7. The debris shield according to claim 1, wherein said low density foam is composed of elements having 16 or less protons.

8. The debris shield according to claim 7, wherein said low density foam is composed of low Z polymers, low Z prepolymers, or both.

9. The debris shield according to claim 8, wherein said low density foam is a silica-based foam or a carbon-based foam.

10. An X-ray transmissive debris shield comprising an X-ray window and a layer of low density foam composed of elements having 16 or fewer protons disposed thereon, wherein said low density foam is made of long carbon chains forming prepolymers, polymers, or a combination thereof, which chains are represented by the empirical formula $(CH_y)_x$ or $(CH_yO_w)_x$ wherein x is within the range of 25 to 50000, y is within the range of 1 to 2, and w is within the range of 0.1 to 1.

11. The debris shield according to claim 10, wherein x is within the range of 50 to 2000.

12. The debris shield according to claim 1, wherein said window is made of low Z elements.

13. The debris shield according to claim 12, wherein said window is made of a material selected from the group consisting of beryllium, carbon, boron, and silicon.

14. The debris shield according to claim 1, wherein said window is made of a material selected from the group consisting of polyimides, polycarbonates, nylons, polystyrenes, polypropylenes, polyethylenes, and polyvinylchlorides.

15. The debris shield according to claim 1, wherein said window has a thickness in the range of 1 to 75 microns.

16. The debris shield according to claim 15, wherein said window has a thickness in the range of 5 to 50 microns.

* * * * *